Nov. 12, 1968 L. W. HACKLEY 3,410,735

METHOD OF FORMING A TEMPERATURE COMPENSATED REFERENCE DIODE

Filed Oct. 22, 1965

INVENTOR.
Lloyd W. Hackley

BY

Mueller, Aichele & Rauner

ATT'YS.

3,410,735

METHOD OF FORMING A TEMPERATURE COMPENSATED REFERENCE DIODE

Lloyd W. Hackley, Sunnyvale, Calif., assignor to Motorola, Inc., Franklin Park, Ill., a corporation of Illinois Filed Oct. 22, 1965, Ser. No. 500,699
2 Claims. (Cl. 148—180)

ABSTRACT OF THE DISCLOSURE

A monolithic, oxide-passivated, temperature-compensated, semiconductor reference diode is fabricated by a method which includes the step of forming an epitaxial layer of N-type conductivity on a P-type silicon crystal, followed by the steps of diffusing a P-type impurity into and through the epitaxial layer, thereby extending the epitaxial junction to the surface of the epitaxial layer, then diffusing a second P-type annular region within that portion of the epitaxial region surrounded by the first annular P-type region, then depositing an aluminum film to cover the central portion of the epitaxial layer encompassed by the second annular P-type region, and heating the composite structure above 900° C. to form an aluminum alloy junction, thereby completing the structure.

This invention relates to a temperature compensated reference diode and more particularly relates to a single die temperature compensated reference diode.

In many Zener diode applications, such as precision voltage regulation, the temperature coefficient of the Zener diode is important and particularly where such applications also include an operational environment in which severe changes in ambient temperature occur. While changes in Zener voltage with temperature are rather small, and therefore acceptable for most applications, in certain applications some form of temperature coefficient compensation or correction is required.

In applications where the reference voltage source must be kept within extremely close tolerances, temperature coefficient compensation may be accomplished by using the forward characteristics of silicon diodes to correct for the effects of the Zener diode temperature coefficient. The temperature coefficient of Zener diodes biased in the avalanche direction is such that the voltage at which avalanche breakdown occurs increases in magnitude as the ambient temperature increases, whereas the temperature coefficient displayed by a junction in the forward direction is one of the opposite sign to that appearing in an avalanche junction and therefore offers possible compensation for the latter characteristic.

In considering the effect that temperature has on the voltage current characteristic of the typical diode in the forward and reverse directions, it is found that the forward characteristic does not vary significantly in reverse voltage breakdown, that is, the Zener voltage rating. However, a change in ambient temperature in the direction of a higher temperature produces a shift in the forward curve in the direction of lower voltage, while the same temperature change produces an increase in the Zener voltage. By combining a silicon diode junction in series in the forward direction with the Zener diode, it is possible to compensate to a large degree for the Zener temperature coefficient. The forward diode may be either a standard rectifier diode or a Zener diode connected in the forward direction.

This method of temperature compensation, however, has a number of objectionable features. For example, to prepare a temperature compensated reference, a Zener diode junction having suitable Zener voltage and a forward biased junction in series with it are required. The reference diode may be prepared either by wiring together separate silicon diodes or by the manufacture of a single device which consists of the active elements stacked and soldered together. The first method, of course, is expensive. In the second method in which the active elements are stacked and soldered, misaligned and poorly soldered elements are common. This frequently gives rise to excessive thermal and electrical resistance through the stack so that over-heating tends to occur, and also gives rise to hot spots within the stack which cause failure of the units when operated at high current levels. Even when the stacked and the soldered joints are excellent, the thermal and electrical resistance of the stack is still rather high due to the fact that the device is made up of several thicknesses of materials that are not particularly good conductors and which have discrete temperature coefficients of resistance and thermal resistance.

An object of the present invention is to provide a temperature compensated reference diode in a single die.

Another object of the invention is to provide a temperature compensated reference diode in which the stacking of the diode elements is eliminated.

A further object of the invention is to provide a temperature compensated reference diode which has low thermal and electrical resistance and which can be operated at a high current level.

An additional object of the invention is to provide a temperature compensated reference diode which is simple in construction and can be conveniently and easily fabricated.

Another object of the invention is to provide a temperature compensated reference diode in a single die in which the electrical characteristics of the diode can be preselected.

A feature of the invention is the provision of a temperature compensated reference diode having two PN junctions, one of which is of the Zener type.

Another feature of the invention is a temperature compensated reference diode having two PN junctions, one of which is of the Zener type and the other of which is arranged relative to the Zener junction so that when the Zener junction is electrically biased in the Zener sense, the second PN junction is biased in the forward sense.

The present invention is embodied in a semiconductor active element for use in temperature compensated diode devices including a single die, a Zener type PN junction in the die and another PN junction therein arranged relative to the Zener junction so that when the Zener junction is electrically biased in the Zener sense, the other PN junction is biased in a forward sense and acts to compensate for the temperature coefficient of the Zener breakdown characteristics of the Zener junction.

Also, the present invention is embodied in a semiconductor active element including a single die comprising a semiconductor crystal element with a semiconductor layer of differing conductivity on one surface of the element defining a forward junction and a region of differing conductivity within the semiconductor layer extending therein and forming a Zener junction.

The invention is illustrated by the accompanying drawing in which.

Figure 1:
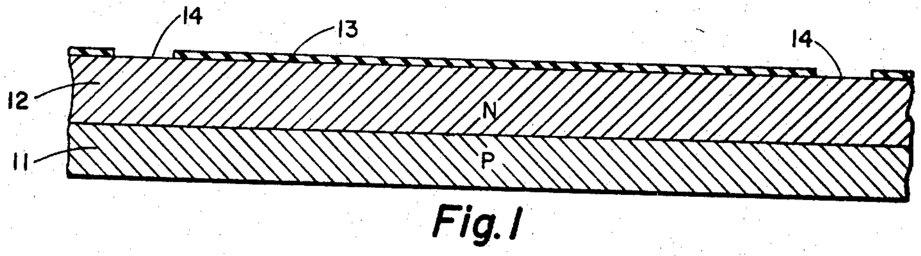
FIG. 1 is a cross-sectional view of a wafer coated with oxide in the fabrication of a semiconductor element of the invention.

As shown in FIG. 1 of the drawing, a P type substrate 11 has an N type layer 12 formed thereon. An oxide film 13 is then formed over the N type layer 12, and a pattern of openings 14 is cut through the oxide film 13 exposing the surface of layer 12.

Figure 2:
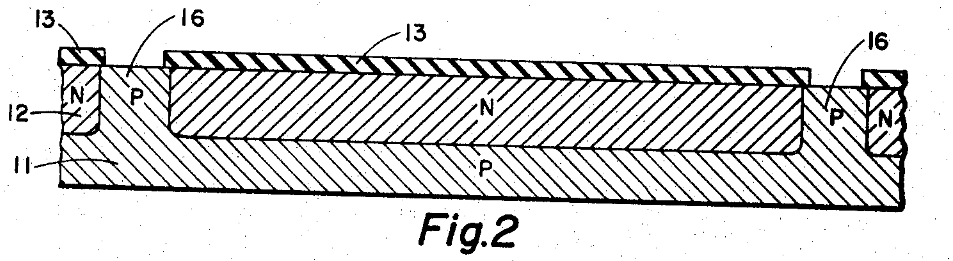
FIG. 2 is a cross-sectional view of the wafer after a first P type isolation diffusion.
Figure 3:
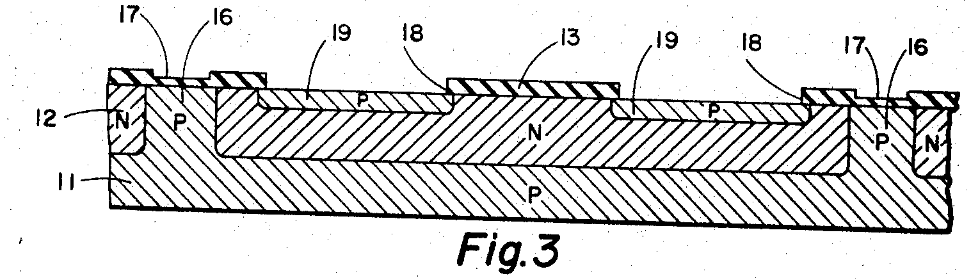
FIG. 3 is a cross-sectional view of the wafer after a P type diffusion in the N layer.
Figure 4:
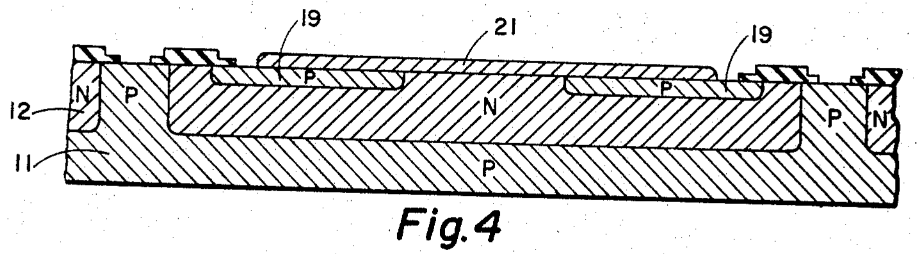
FIG. 4 is a cross-sectional view of the wafer after the deposition of a metal film.
Figure 5:
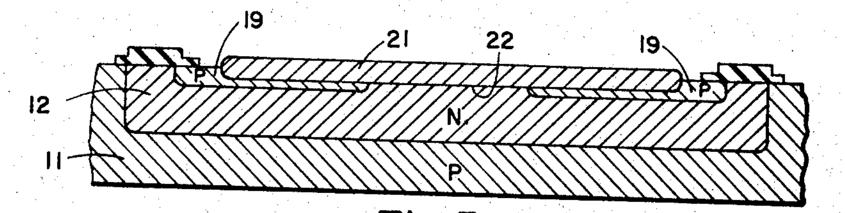
FIG. 5 is a cross-sectional view of a semiconductor element of the invention.

In FIG. 2 is shown a diffused annular region 16 formed by diffusing a P type impurity into the N type layer 12. Thereafter, an oxide film 17 is formed over the surface of the P type region 16 as shown in FIG. 3. Also, as shown in FIG. 3, an annular opening 18 is formed in the oxide layer 13 and a P type impurity diffused through the opening to form P type annular region 19. Thereafter, the oxide layer 13 over the P type region 19 is removed and a metal film 21 is deposited on the surface of the wafer to cover P type region 19 and the exposed surface of N type layer 12 (FIG. 4). The wafer is heated to alloy the metal film 21 with the wafer and form an alloyed junction 22 (FIG. 5). The wafers are then diced. Appropriate leads and connections are connected to each die to form the desired temperature compensated diode of the invention.

The starting material for the semiconductor element of the present invention generally is a single crystal element. The crystal element is advantageously a wafer which is typically obtained from a larger crystal grown by known crystal pulling or crystal melting processes. The larger crystal is sliced into wafers and the wafers lapped, polished or otherwise processed. The cross-sectional dimension of the wafers may be of any value, and the thickness of the wafers may be of a practical range; e.g., about 4 to 40 mils.

The substrate is advantageously a P type substrate. The layer of semiconductor material of differing conductivity to the substrate has a resistivity of which is dictated by the Zener voltage desired. The layer is advantageously formed by an epitaxial growth step which is well known in the semiconductor art. The layer preferably is formed by passing a mixture of gaseous semiconductor compound and an N type impurity over the surface of a wafer while it is at an elevated temperature which is above about 500° C. for germanium and above about 800° C. for silicon. The gaseous compound advantageously is a halide or a hydride of the semiconductor material in the substrate.

After the layer of differing conductivity is formed on the substrate, an insulating layer of oxide is formed on the surface. This layer is preferably formed by thermally oxidizing the semiconductor layer. Also, the oxide layer may be formed by pyrolytic decomposition.

A pattern is formed over the surface of the oxide, for example, by using a photoresist composition. The resist coating may be exposed to light and the unexposed portions washed away leaving the hardened or exposed portions thereof to form the pattern. The exposed surface of the oxide film is etched away exposing the epitaxial layer.

A P type impurity is diffused into the exposed portion of the epitaxial layer and through the layer to the P type substrate. The diffusion may be accomplished by conventional semiconductor diffusion methods, and advantageously with a gaseous diffusion source such as boron trichloride. The formation of the P type region divides the N type layer into individual islands.

The wafer is heated to thermally grow an oxide layer over the diffused P region and at the same time to cause a redistribution of the P type impurities in the newly formed P type region.

An annular opening is cut in the oxide layer over the N type island and P type impurities diffused into the exposed portions of the N type island to form an annular P type region. Advantageously, the depth of the N type island below this P type region is at least 10 microns.

Thereafter, the oxide layer over the P type region and the exposed surface of the N type layer is removed. A thin film of metal, preferably aluminum, is deposited over the surface of the wafer, advantageously, by vacuum evaporation. A resist pattern preferably is formed over the surface of the metal and the unwanted portions of the film etched away, leaving pads of metal over the P type regions in the N type islands.

The wafers then are heated to an elevated temperature, preferably above about 900° C., to alloy a portion of the metal into the surface of the wafer and form an alloyed junction therein. The alloying operation is advantageously conducted in an inert atmosphere, such as nitrogen gas.

The above description and drawing show that the present invention provides a temperature compensated reference diode in a single die and thus provides a device superior to previous multichip devices. Furthermore, the diode of the invention has low thermal and electrical resistance and can be operated at a high current level. Also, the structure of the invention permits preselection of the electrical characteristics. Moreover, since all of the junctions terminate under passivating oxide films, greater inherent stability of the diode is provided. Furthermore, control of the distance between the junctions permits lower dynamic impedance than is possible with conventional multichip devices.

It will be apparent from the above description and drawing that various modifications in the detailed procedures set forth may be made within the scope of the invention. Therefore, the invention is not intended to be limited to the specific procedures except as may be required by the following claims.

What is claimed is:

1. A method of forming a semiconductor active element for use in temperature compensated reference diode devices including the steps forming a semiconductor layer on a semiconductor crystal element of differing conductivity, forming a first annular region of conductivity the same as said crystal element in said semiconductor layer to divide the same into islands, forming a second inner annular region of conductivity the same as said first region in one of said islands, depositing a metal film to cover said island and said second annular region, and heating the resulting combination to an elevated temperature to alloy said metal into said second annular region and said island.

2. A method forming a semiconductor active element for use in temperature compensated reference diode devices including the steps of forming an N type semiconductor layer on a P type semiconductor single crystal element, diffusing a P type impurity into said N type layer to form a first P type annular region and divide the N type layer into islands, diffusing a second inner P type annular region into one of said islands, depositing an aluminum film to cover said island and said second P type annular region, and heating the resulting combination to a temperature above about 900° C. to alloy said aluminum into said second P type annular region and said island and form a Zener junction therewith.

References Cited

UNITED STATES PATENTS

| | | | |
|---|---|---|---|
| 3,183,129 | 5/1965 | Tripp | 148—177 |
| 3,197,681 | 7/1965 | Broussard | 148—187 |
| 3,341,377 | 9/1967 | Wacker | 148—180 |
| 3,345,216 | 10/1967 | Rogers | 148—1.5 |

RICHARD O. DEAN, *Primary Examiner.*